United States Patent [19]

Rowe et al.

[11] 4,289,838

[45] Sep. 15, 1981

[54] DIAZO-UNSATURATED MONOMER LIGHT SENSITIVE COMPOSITIONS

[75] Inventors: William Rowe, Westfield, N.J.; Eugene Golda, Monsey, N.Y.

[73] Assignee: Polychrome Corporation, Yonkers, N.Y.

[21] Appl. No.: 177,664

[22] Filed: Aug. 13, 1980

Related U.S. Application Data

[63] Continuation of Ser. No. 865, Jan. 4, 1979, abandoned, which is a continuation of Ser. No. 595,466, Jul. 14, 1975, abandoned, which is a continuation of Ser. No. 315,207, Dec. 14, 1972, abandoned.

[51] Int. Cl.$^3$ .................. G03C 1/60; G03C 1/54; G03F 7/08
[52] U.S. Cl. ................... 430/163; 430/175; 430/176; 430/171; 430/192; 430/197; 430/284; 430/906; 430/325; 430/326; 430/302
[58] Field of Search .............. 430/175, 176, 192, 197, 430/284, 906, 302, 163, 171, 325, 326

[56] References Cited

U.S. PATENT DOCUMENTS

| | | | |
|---|---|---|---|
| 3,208,850 | 9/1965 | Daech | 430/176 |
| 3,396,019 | 8/1968 | Uhlig | 430/175 |
| 3,552,962 | 1/1971 | Notley | 430/176 |
| 3,652,272 | 3/1972 | Thomas | 430/156 |
| 3,655,625 | 4/1972 | Thomas | 430/156 |
| 3,660,097 | 5/1972 | Mainthia | 430/192 |
| 3,732,105 | 5/1973 | Klupfel et al. | 430/175 |
| 3,840,390 | 10/1974 | Kozu et al. | 430/285 |
| 3,850,770 | 11/1974 | Juna et al. | 430/284 |

FOREIGN PATENT DOCUMENTS

| | | | |
|---|---|---|---|
| 975456 | 11/1964 | United Kingdom | 430/176 |
| 1280885 | 7/1972 | United Kingdom | 430/175 |

OTHER PUBLICATIONS

Kosar, J., "Light-Sensitive Systems", J. Wiley & Sons, 1965, pp. 175-180.

*Primary Examiner*—Charles L. Bowers, Jr.

[57] ABSTRACT

Improved compositions comprising solvent-soluble, negative-acting or positive-acting light-sensitive diazonium compounds and solvent-soluble unsaturated monomers which are the products of about two equivalents of an organic diisocyanate with about one equivalent of an active hydrogen-containing organic compound, e.g., an alcohol or amine, preferably a polyol, which products are subsequently reacted with an unsaturated compound which contains an active-hydrogen, preferably in a hydroxyl group, available to react with the remaining isocyanate groups. The compositions can be coated onto suitable base sheet materials to form presensitized lithographic printing plates, proofs for multi-color printing, visual aids, printed circuits and the like.

8 Claims, No Drawings

DIAZO-UNSATURATED MONOMER LIGHT SENSITIVE COMPOSITIONS

CROSS REFERENCE TO RELATED APPLICATIONS

This application is a continuation of of U.S. patent application Ser. No. 865, filed Jan. 4, 1979 now abandoned which is a continuation of U.S. patent application Ser. No. 595,466 filed July 14, 1975, now abandoned which was a continuation of U.S. patent application Ser. No. 315,207 filed Dec. 14, 1972, now abandoned.

This invention relates to light-sensitive resinous compositions that are especially suitable for many purposes, including making lithographic plates, multi-color proofs, visual aids and printed circuits, and more particularly to compositions containing a light-sensitive, negative-acting or positive-acting diazonium compound and certain unsaturated monomers, more specifically described hereinafter, that can be coated onto suitable base materials, such as lithographically or electroconductively suitable metals, plastics such as Mylar TM and the like, exposed to light through a negative or positive image transparency and may be developed with a totally or substantially totally aqueous developer.

Among the numerous improvements and advantages provided by this invention are, briefly, the integration of a light-sensitive material and a long-lasting image- or object-forming material that can be applied as a single coating onto an appropriate base, which coating (1) is more light-sensitive than many other currently commercial diazosensitized systems, (2) may be developed on the base with relatively inexpensive, non-volatile, non-toxic, wholly or substantially wholly aqueous desensitizing or developing solutions, (3) has on the base substantially at least the shelf life, storability, light-sensitivity and durability of, e.g., currently commercial presensitized lithographic plates, and generally substantially longer presslife, (4) requires no hand lacquering after development, and (5) can be satisfactorily developed to form high quality, sharp fine objective areas or images quickly and easily by relatively unskilled workers without undue care to avoid impairment.

The art of lithographic printing, to which this invention is eminently suited, is based upon the immiscibility of grease and water, and takes advantage of that phenomenon by utilizing the preferential retention on an image area of a transferable, greasy, image-forming substance and the similar retention on a corresponding non-image area of an aqueous dampening fluid. If an oleophilic image is formed upon a suitable surface and the entire surface then is moistened with an aqueous solution, the image area will repel the water whereas the non-image area will retain the water. Upon subsequent application to the entire surface of a greasy ink, the image portion of the surface retains the ink whereas the moistened non-image portion repels it. The ink on the image area then can be transferred to the surface of a suitable material on which the image is to be reproduced, such as paper, cloth and the like. Transferring the ink usually includes the use of an intermediary surface, such as a so-called offset or blanket cylinder, to avoid reversal of the image, or mirror-image printing.

Lithographic plates, such as those to which the present invention is adapted, have a coating of a light-sensitive composition that is adherent to a suitable base sheet material, for example, an aluminum sheet. If the light-sensitive coating is applied to the base sheet by the manufacturer, the plate is referred to as a "presensitized plate." If the light-sensitive coating is applied to the base by a lithographer or a trade platemaker, the plate is referred to as a "wipe-on" plate. Depending upon the nature of the photosensitive composition employed, a coated plate can be utilized to reproduce directly the image to which it is exposed, in which case the plate is termed positive-acting, or to reproduce an image complementary to the one to which it is exposed, in which case the plate is termed negative-acting. In either event the image area of the developed plate is relatively oleophilic and the non-image area is relatively hydrophilic.

A negative lithographic plate is exposed to light through a negative transparency of the desired image. The light causes the exposed light-sensitive material, commonly a diazo compound, to harden the coating on the plate, making the exposed area insoluble to a desensitizing solution thereafter applied onto the plate for the purpose of removing the portion of the light-sensitive coating which, because it was protected from the light by the negative, was not hardened. The light-hardened surface of a negative plate is the oleophilic surface compatible with the greasy printing ink and is called the "image area"; the surface from which the non-hardened light-sensitive coating is removed by the desensitizer is, or can be converted to, a hydrophilic surface having little affinity for the greasy ink and is called the "non-image" area.

In usage, a positive plate differs in that the hydrophilic non-image area is formed in the portion of the light-sensitive coating exposed to light through a positive image transparency whereas the unexposed portion is either oleophilic or convertible to an oleophilic state to form the ink-receptive image area.

Several attempts have been made by others to prepare lithographic plates having coated thereon a resinous material capable of being formed into a desired image to serve as the ink-receptive printing surface. Such plates, however, have been either or both totally different from the ones of this invention and commercially unacceptable. For example:

U.S. Pat. No. 3,136,637 discloses a lithographic plate having an aluminum base sheet, a first coating of a light-sensitive diazo compound on the base and a second, distinct coating of a resinous material thereover. The top resin layer of the multiply-coated plate is solvent soluble and is suitable as a printing surface once non-image areas are removed. Such areas are removed by removing unexposed areas of the underlying first coating of diazo, literally undermining the overcoated resinous layer. An inherent problem of such plates is that they can be inadvertently over-developed, e.g., removal of image area by undermining, due to the distinctness of the separate coatings.

U.S. Pat. No. 3,211,553 discloses a lithographic plate having a positive-acting light-sensitive coating composed of a positive-acting complex phosphotungstate diazonium compound and specific resinous materials. There is no suggestion in the patent that a corresponding negative-acting plate can be made inasmuch as the patentee begins with a negative-acting lithographic diazo that must be converted chemically with a phosphotungstic acid, or that monomers such as those of this invention are suitable. The plates are developed, i.e., exposed areas are removed, with an essentially organic solvent medium.

Kosar, in his book *Light Sensitive Systems* (Wiley, 1962), suggests incorporating negative-acting diazos along with organic colloids such as gelatin and dextrin, or synthetic resins such as polyvinyl alcohol and methyl cellulose, to form lithographic coatings. Because of their hydrophilic character, however, such resinous materials do not form ink-receptive image-printing surface areas, and therefore are unsuitable for making lithographic plates according to this invention.

U.S. Pat. No. 2,826,501 describes a lithographic plate coating composition containing a light-sensitive condensation product of p-diazo-diphenylamine with formaldehyde and about nine times as much of a water-soluble superpolyamide nylon resin. The condensation product and the nylon resin are coated from an aqueous solution, and their specific proportions are said to be both critical and within a narrow range. Moreover, an exposed plate prepared according to that patent must be developed with an organic developing solution, a totally aqueous or substantially aqueous developer being unsuitable. As pointed out in U.S. Pat. No. 3,136,637, the selection of resinous materials is limited, processing difficulties occur in making the compositions, especially in the selection and use of proper commercial solvents, the presslife of such plates is not significantly improved over other plates, and the image areas of the developed plates should be further treated or coated prior to use.

U.S. Pat. No. 3,660,097 describes the use of compositions containing a linear polyurethane resin and a negative— or positive—acting diazonium compound. Some disadvantages of these compositions which are concomitant with their advantages are the difficulty of dissolving the compositions in a solvent in order to coat them on a substrate. Consequently, development of, e.g., an exposed lithographic plate to remove non-image areas is rendered difficult because of lack of a requisite for lithographic plates, i.e., a clear-cut differential in solubility between image and non-image areas. Freshly coated plates which have been exposed require a good deal of scrubbing in order to remove the non-image areas of the coated composition. Aged plates would require even more scrubbing. Aqueous developers will develop the plates, but the developers should contain sizable amounts of solvents, e.g., n-propyl alcohol, benzyl alcohol, cyclohexanone, etc. in order to successfully develop the plate so that it has clean, non-ink receptive, non-image areas. Many times it is found helpful to formulate a developer containing an acid, e.g., phosphoric, in order to clean out the "background", i.e., the non-image areas of the plate. Relative to lithographic plates coated with the light-sensitive compositions of this invention, those of U.S. Pat. No. 3,660,097 are "slower", i.e., they require longer exposure times.

It is an object of this invention to provide certain light-sensitive compositions suitable for forming an image or an object area on a suitable base. Another object of this invention is to provide such compositions for coating into a lithographic printing plate to form improved presensitized plates. It is also an object of this invention to provide lithographic printing plates that have highly abrasion-resistant and wear-resistant oleophilic image-forming surfaces and thus provide long presslife. A further object of this invention is to provide presensitized negative-acting or positive-acting lithographic printing plates that have light-sensitive diazonium-sensitized coatings containing certain unsaturated monomers, which coatings are adapted to form, upon exposure to light, an ink-receptive image printing area, which plate is stable to ordinary ambient heat and humidity conditions during storage for protracted periods of time. Another object of this invention is to provide lithographic printing plates having such coatings which are capable of forming oleophilic image areas that are long-running and have excellent abrasion-resistance, which plates after exposure to light through an image transparency, may be developed with solvents or with a totally aqueous or substantially totally aqueous developer medium that removes the light-sensitive coating from non-image areas, and which plates require no hand lacquering or other treatment of the image surface. Still another object of this invention is to provide light-sensitive diazonium-sensitized compositions containing certain unsaturated monomers for coating onto suitable base sheets that can then be used, by exposure to light, development and further treatment as might be necessary, to make a variety of useful articles, for example, silk screens, visual aids, proofs in advance of multicolor printing and printed circuits. These and other objects of this invention will be in part discussed in and in part apparent from the following more detailed disclosure.

Broadly, the instant invention involves compositions containing (a) solvent-soluble, negative-acting or positive-acting, light-sensitive diazonium components that can be any of the commonly used lithographic diazo compounds, or reaction or condensation products of such diazo compounds with agents therefor that do not materially impair the light-sensitivity of the diazo, and (b) certain unsaturated monomers which are the products of about two equivalents of an organic diisocyanate with about one equivalent of an active hydrogen-containing organic compound, e.g., an alcohol or amine, preferably a polyol, which products are subsequently reacted with an unsaturated compound which contains an active-hydrogen, preferably in a hydroxyl group, available to react with the remaining isocyanate groups. In one embodiment the invention involves a light sensitive element which comprises: a substrate and an ultraviolet radiation curable composition applied to at least one surface of said substrate, which composition comprises the admixture of:

I. From about 10 to 95% by weight of an unsaturated monomer, based on total weight of the unsaturated monomer and diazonium compound, wherein the unsaturated monomer is the reaction product of:
   A. one equivalent of an isocyanate containing intermediate which is the reaction product of
      i. about one equivalent of a polyol with
      ii. two equivalents of a diisocyanate and
   B. one equivalent of a monomeric olefinically active hydrogen in the form of a hydroxyl group, said reaction product being a monomeric, solvent-free liquid containing zero percent free isocyanate groups, and II. From about 1 to 95% by weight, based on the weight of the unsaturated monomer, of one or more solid resins selected from the group consisting of polyurethanes, epoxies, polyvinyl acetals, polyethylene oxides, polyamides, phenol formaldehydes, acrylics, urea-formaldehydes, and cellulosic resins, and III. An effective amount of a light sensitive, negative acting diazonium compound, Whereby before light exposure said admixture is organic solvent soluble, water emulsifiable and is capable of forming a non-tacky solid film and after light exposure said admixture is not soluble in organic solvents and is non-water emulsifiable.

Such compositions can be coated onto suitable bases, such as metals and plastics, fabric, paper, etc. from an essentially organic solvent medium to form, for example, storage-stable presensitized lithographic plates, printed circuit boards, presensitized silk screens, or presensitized paper printing mats. After exposure to light of the coated bases, non-image areas of the coated composition may be removed from the base with solvent developers, or a completely or substantially completely aqueous develoer that acts upon the bonds between the underlying base material and (for negative-acting) the light-sensitive diazonium component in the coating, or (for positive-acting) the light-reacted diazonium component in the coating, to loosen that bond, and thereby remove the coating composition. Plates and other articles according to this invention, both in the presensitized state and after exposure and development, are characterized by unusually good to exceptional stability during storage and subsequent handling and usage to such known common deteriorating factors, during storage, as moisture, heat and "dark reaction," and during use, as abrasion, decrease of oleophilicity, wear and weakening of mechanical strength. In particular, the exceptional abrasion-resistance of plates according to this invention results in unusually long press life, for example, in the order of up to about 5 to 10 times the press-life of some commercially available plates. Fine, sharp, clear images or objects can be formed on appropriately coated bases to make high quality, accurate printed circuits, silk screens, paper printing mates, color proofs, visual aids and, in the case of lithographic plates, great numbers of excellent quality reproductions.

Virtually any material known and commonly used as a lithographic base surface for printing plates presently appears possible to use as a base on which to coat and use the light-sensitive compositions of this invention. Such lithographic base surfaces include those made from paper, from synthetic resins and, especially in the case of long-running, dimensionally stable plates, from metals. Of the commonly used metals such as steel, stainless steel, zinc, aluminum, copper and chromium, sheets made of aluminum are preferred for a variety of reasons known in the art. Before applying the composition of this invention to the base, which desirably is in sheet form, the base can be treated in ways known to the art to enhance its character as a lithographic surface. For example, a metal plate can be grained either mechanically or chemically, e.g., as disclosed in U.S. Pat. Nos. 2,882,153 and 2,882,154, to enable better bonding of the coating applied on to it. An aluminum sheet can be anodized electrolytically to form a harder, more wear-resistant and abrasion-resistant surface, e.g., as disclosed in U.S. Pat. No. 3,440,050 and British Pat. No. 1,235,863. It is also possible to place an intermediate coating on the base surface to provide a firmer bond between the surface and the overcoated diazonium-sensitized composition of this invention. Intermediate bonding layers generally are formed on the plate by application of water-soluble silicates or, preferably, solutions of salts or acids or Group IV-B metal fluorides, for example, potassium zirconcium hexafluoride and the acid thereof as disclosed in U.S. Pat. Nos. 2,946,683 and 3,160,506. These and other methods of treating lithographic base sheets are known in the art and can be utilized, as might be desired or advantageous, along with the compositions of this invention.

In general the diazonium components of the light-sensitive coating compositions of this invention are the negative-acting or positive-acting light-sensitive diazos known and commonly used in the lithographic art.

Negative-acting diazo compounds, broadly, are diazo-aromatics, and more particularly are diazo-arylamines that can be substituted on the aromatic nucleus or on the amino-nitrogen, preferably p-diazo-diphenylamine and derivatives thereof, for example, condensation products thereof with organic condensing agents containing reactive carbonyl groups such as aldehydes and acetals, particularly condensates with compounds such as formaldehyde and paraformaldehyde. The preparation of such eminently suitable condensation products is disclosed in U.S. Pat. Nos. 2,922,715 and 2,946,683.

The foregoing diazo compounds may be reacted with suitable coupling agents to prepare reaction products that are at least partially soluble in organic solvents, preferably well soluble, and that have light-sensitivity not substantially less than the starting diazo. The reaction products are only slightly water-soluble, if at all. Suitable coupling agents are generally essentially organic compounds that react with the water-soluble diazo compounds to reduce the latter's ionic character and make them more covalent, do not reduce significantly their light-sensitivity, and produce reaction products that are soluble in organic solvents, but not more than only slightly water-soluble. Such coupling agents in general presently appear to be acidic compounds, for example, the phosphinic, phosphonic, sulfonic and carboxylic acids of benzene, toluene and naphthalene and their derivatives, for example, the alkali metal salts thereof; hydroxyl-containing aromatic compounds, e.g., phenolics such as diphenolic acid, benzophenone, substituted benzophenones, naphthols, naphthalene diols and alizarins, including sulfonic acids and alkali metal sulfonic acid salts thereof; and acidic aliphatic compounds such as stearic acid and ethylene-diamine tetra-acetic acid. Particularly suitable coupling compounds of the type described include toluene sulfonic acid, benzene phosphinic acid, 2,5-dimethyl-benzene sulfonic acid, benzene sulfonic acid sodium salt, nitrobenzene acetic acid, diphenolic acid, 2,3-naphthalene diol, naphthalene-2-sulfonic acid, 1-naphthol-2-(or -4-)-sulfonic acid, 2,4-dinitro-1-naphthol-7-sulfonic acid, 2,4-dihydroxy-benzophenone, 2, 2'-dihydroxy-4,4'-dimethoxy-benzophenone, 2,2',4,4'-tetra-hydroxy-benzophenone, 2-hydroxy-4-methoxy-benzophenone-5-sulfonic acid, m-(p'-anilino-phenylazo)-benzene sulfonic acid sodium salt, p-morpholino-benzene diazonium fluoborate, alizarin sodium monosulfonate and o-toluidine-m-sulfonic acid. Some of those coupling agents and the preparation of coupled products thereof with light-sensitive diazo compounds are disclosed in U.S. Pat. Nos. 3,300,309 and 3,591,575.

The diazo components and the coupling agent preferably are reacted together in approximately equimolecular quantities.

Positive-acting diazo resins known to the art that can be used in taking advantage of this invention include several principal types of light-sensitive compositions. One type are esters of a 1,2-diazoquinone-sulfonic acid chloride or a 1,2-diazo-naphthoquinone-sulfonic acid chloride with a polyhydroxy phenol, the latter being a condensation product preferably of pyrogallol and acetone. Such esters are disclosed in U.S. Pat. No. 3,635,709. Another type of suitable diazo resins are esters of sulfonic acids of ortho-diazophenyls, particularly quinone-(1,2)-diazides and naphthoquinone-(1,2)-diazides with phenolformaldehyde resins. Such esters are disclosed in a number of patents, e.g., U.S. Pat. Nos. 3,046,120 and 3,188,210. Another type of suitable diazo resins are phosphotungstate diazonium salts, for example, a reaction product of phosphotungstic acid with an acid salt of hexafluorophosphoric acid and the condensation product of paradiazodiphenyl-amine with formaldehyde. Such diazo resins are disclosed in U.S. Pat. No. 3,211,553. Other positive- or negative-acting diazo components known in the art may also be used.

The unsaturated monomers mentioned above which are used in the improved compositions of this invention are the subject of a patent application of William Rowe filed concurrently herewith. The unsaturated monomers may also contain a polymeric moiety.

Generally, they are the reaction products of two equivalents of an organic diisocyanate with one equivalent of an active hydrogen-containing compound, which intermediate products are subsequently reacted with an unsaturated compound which contains an active hydrogen atom. The active hydrogen atoms referred to are those which display activity according to the Zerewitinoff test as described by Kohler, J. Am. Chem. Soc. 49, 3181 (1927).

Illustrative of the useful compounds containing active hydrogen atoms are those in which the active hydrogen atoms are attached to oxygen, nitrogen, or sulfur, i.e., the groups containing the active hydrogen are hydroxyl, mercapto, imino, amino, carboxyl, carbamoyl, substituted carbamoyl, sulfo, sulfonamido, thiocarbamoyl, substituted thiocarbamoyl, and the like. The compound can otherwise be aliphatic, aromatic, or cycloaliphatic, or of mixed types.

Illustrative of the diisocyanates are, e.g., the aromatic, aliphatic, and cycloaliphatic diisocyanates, and combinations thereof. More specifically illustrative of the diisocyanates are 2,4-tolylene diisocyanate, m-phenylene diisocyanate, xylylene diisocyanate, 4-chloro-1,3-phenylene diisocyanate, 4,4'-biphenylene diisocyanate, 1,4-tetramethylene and 1,6-hexamethylene diisocyanate, 1,4-cyclohexylene diisocyanate, 1,5-tetrahydronaphthalene diisocyanate, methylene dicyclohexylene diisocyanate and the like. Diisocyanates in which each of the two isocyanate groups is directly attached to a ring are preferred, since, generally, they react more rapidly with polyols, or other active hydrogen-containing compounds. Especially preferred types are

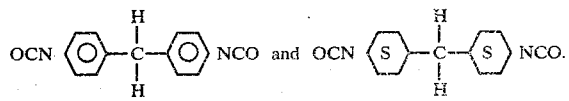

Other polyisocyanates, those having more than two isocyanate groups, may also be used. They may be prepared in different ways. For example, water may be used as an active hydrogen containing compound in the preparation of the polyisocyanate. Biuret polyisocyanates are thereby produced in accordance with the disclosure of U.S. Pat. No. 3,124,605, which describes a compound having not more than six —NCO groups and the formula:

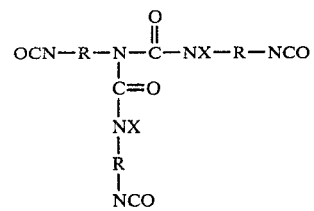

wherein X is selected from the group consisting of hydrogen and the grouping —CO—NX—R—NCO and R is the organic radical left after removal of the two —NCO groups from an organic diisocyanate selected from the group consisting of cyclohexane diisocyanate, hexamethylene diisocyanate, phenylene diisocyanate, lower alkyl substituted phenylene diisocyanate, lower alkoxy phenylene diisocyanate, diphenylmethane diisocyanate, dicyclohexyl diisocyanate and chloro-substituted phenylene diisocyanate, said hydrogen being the only one on the compound which is reactive with an —NCO group. The polyisocyanates can contain other substituents, although those which are free from reactive groups other than the isocyanates groups are preferred. Mixtures of polyisocyanates may also be used to prepare the unsaturated monomers used in this invention.

Illustrative of the active hydrogen-containing compounds used to prepare the intermediate for the unsaturated monomers used in this invention are those containing aliphatic hydroxyl, phenolic hydroxyl, thiol, carboxyl, amine or amide groups. Those compounds which contain more than one active hydrogen atom per molecule are preferred.

Illustrative of the hydroxyl containing compounds which may be used are the alkanols containing up to about 18 carbon atoms, e.g., methanol, ethanol, propanol, butanol, etc; cycloalkanols, e.g., cyclohexanol, etc; the alkenols, e.g., allyl alcohol, etc.; and the polyols.

Illustrative of the polyols are the diols, triols, tetrols, etc. The monomeric diols, triols and tetrols are generally preferred.

More specifically illustrative of the monomeric diols are ethylene glycol; propylene glycol; 1,3-butylene glycol; 1,4-butane diol; 1,5-pentanediol, hexamethylene glycol, etc. More specifically illustrative of the monomeric triols are 2-(hydroxymethyl)-2-methyl-1,3-propanediol, trimethylolpropane, glycerol, castor oil, etc. More specifically illustrative of the tetraols is pentaerythriol. The polyols may also be of the polyester or polyether type, the former being preferred.

Particularly preferred polyester polyols are those derived from the reaction of lactones, e.g., ε-caprolactones, with diols, triols and polyols of low molecular weight (up to about 200), e.g., ethylene glycol, propylene glycol, butylene glycol, and the like; diethylene glycol, dipropylene glycol, and the like; glycerine, trimethylol ethane, trimethylol propane, and the like; pentaerithrytol, and the like. Many of these preferred polyester polyols are commercially available, e.g., a diol with a molecular weight of 530, a diol with a molecular weight of 830, a diol of a molecular weight of 1250, a diol of a molecular weight of 2000, a triol of a molecular weight of 540 and a triol of a molecular weight of 800.

Additional polyester polyols which may be used to form the intermediates are those classes which are described on pages 44 to 48 of *Polyurethanes-Chemistry and Technology, Part I. Chemistry* by Saunders and Frisch (Interscience, 1962).

Illustrative of the polyethers which may be used to form the intermediates are those described on pages 32 to 44 of that volume. Because of their hydrophilic character, those polyethers which contain a preponderance of ethyleneoxy units are not preferred for use in preparing lithographic printing plates, if that preponderance results in an unacceptably low ink receptivity by the image areas of the coating on the plate. In a proper formulation, however, the ethyleneoxy content may not have an adverse effect on ink receptivity, but the hydrophilicity will contribute to ease of removal of non-image areas from an exposed lithographic plate by means of an aqueous developer.

The polyol may also be an epoxy resin having pendant hydroxyl groups.

Illustrative of the phenols which may be reacted to form the intermediates are phenol, O-cresol, 4,4′-propylidenediphenol, 4,4′-isopropylidenediphenol, etc.

Illustrative of the thiol compounds which may be used to prepare the intermediates are the monothiols, e.g., 1-butanediol, 1-dodecanethiol, tert-butanethiol, etc.; and the polythiols.

The polythiols may be simple or complex organic compounds having a multiplicity of pendant or terminally positioned -SH functional groups per average molecule. On the average the polythiol should contain two or more —SH groups per molecule and have a viscosity range of from about 100 to about 10,000 cps. at 70° C. as measured by a Brookfield Viscometer either alone or when in the presence of an inert solvent, aqueous dispersant, or plasticizer.

Polythiols such as the aliphatic monomeric polythiols exemplified by ethane dithiol, hexamethylene dithiol, decamethylene dithiol, tolylene-2,4-dithiol, and the like, and polymeric polythiols such as thiol-terminated ethylcyclohexyl dimercaptan polymer, and the like, are operable but may not be widely accepted from a practical commercial point of view because of obnoxious odors. Examples of the polythiol compounds preferred because of relatively low odor level include esters of thioglycolic acid (HS—CH$_2$COOH), α-mercaptopropionic acid (HS—CH(CH$_3$)—COOH), and β-mercaptopropionic (HS—CH$_2$CH$_2$COCH) with polyhydroxy compounds such as glycols, triols, tetraols, pentaols, hexaols, and the like. Specific examples of the preferred polythiols include ethylene glycol bis(thioglycolate, ethylene glycol bis(β-mercaptopropionate), trimethylolpropane tris(thioglycolate), trimethylolpropane tris(β-mercaptopropionate), pentaerythritol tetrakis (thioglycolate), and pentaerythritol tetrakis (β-mercaptopropionate), all of which are commercially available. A specific example of a preferred polymeric polythiol is poly(propylene ether) glycol bis(β-mercaptopropionate) which is prepared from poly(propylene ether) glycol (e.g., Pluracol P-2010, Wyandotte Chemical Corp.) and β-mercaptopropionic acid by esterification.

The preferred polythiol compounds are characterized by a low level of mercaptanlike odor initially.

Illustrative of compounds which contain carboxyl groups and which may be used to prepare the intermediates are acetic acid, cinnamic acid, β-phenylpropionic, succinic acid, adipic acid, terephthalic acid, thiodipropionic acid, and the like.

Illustrative of the amines which may be reacted to form the intermediates are ammonia, ethylamine, n-propylamine, n-butylamine, n-amylamine, aniline, and the like; and the polyamines, e.g., m-phenylenediamine, propylenediamine, ethylene diamine, 2,4-tolylenediamine, and the like.

Illustrative of other compounds which may be used to prepare the intermediates are the amides, e.g., adipamide, etc.; mixed amino-containing compounds, e.g., monoethanolamine, 4-amino-benzoic acid, aminopropionic acid, etc.; sulfonamide containing compounds, e.g., 1,4-cyclohexanedisulfonamide, 1,3-propanedisulfonamide, etc.

Illustrative of the olefinically unsaturated active hydrogen-containing compounds which may be reacted with the intermediates are those which contain at least one active hydrogen atom and at least one addition polymerizable olefinically unsaturated grouping, i.e., >C=C<. Those compounds containing one of each of these groups are preferred. Specifically illustrative of such monomeric unsaturated compounds are those containing active hydrogen atoms in groups mentioned above and an unsaturated grouping, preferably present as terminal unsaturation, i.e., the vinyl and acrylic compounds. Illustrative of the active hydrogen containing groups are hydroxy, mercapto, carboxy and amino. Illustrative compounds would generally be those composed of carbon, hydrogen, oxygen, sulfur and/or nitrogen. Illustrative formulas of such compounds are HORCH=CH$_2$, HSRCH=CH$_2$, HOOCRCH=CH$_2$ and H$_2$NRCH=CH$_2$. It is preferred that the monomeric unsaturated compound contain from about 3 to about 12 carbon atoms. Exemplary unsaturated compounds are acrylic acid, cinnamic acid, methacrylic acid, hydroxyalkyl acrylates and methacrylates, e.g. hydroxyethyl acrylate and methacrylate, cinnamyl alcohol, allyl alcohol, diacetone acrylamide, unsaturated compounds containing a secondary amino or amido groups, and the like.

Illustrative of the active hydrogen-containing compounds which may be reacted with the intermediates to form diluents and/or plasticizers are those not containing olefinic unsaturation indicated above, e.g., the alkanols, the phenols, the secondary amines, the carboxylic acids, etc., as well as compounds such as H$_2$NR—OH and

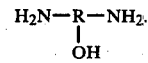

It is preferred that the compounds contain up to about 12 carbon atoms, more preferably up to about 18 carbon atoms.

A procedure which may be used to prepare the unsaturated monomers of this invention comprises placing about 2 equivalents of the organic diisocyanate in a reaction vessel for each equivalent of active hydrogen in the monomeric active hydrogen containing compound. The water-free diisocyanate may be reacted under an inert gas atmosphere, e.g., nitrogen, with the water-free active hydrogen containing compound at temperatures of from about room temperature to about 70° C. Elevated temperatures are preferred. The active hydrogen containing compound, e.g., polyol, must be added slowly, e.g., incrementally, with stirring or agitation to the diisocyanate which is maintained at the reaction temperature e.g., 65°±5° C. by the rate of addition and/or heating and/or cooling depending on the exotherm developed. Instantaneous concentration of active hydrogen containing compound in the reaction mixture is kept low by slow, incremental addition thereof, thereby reducing or eliminating polymer formation. The temperature of the reaction is also kept under control and low enough so that allophonate and biuret formation and also any possible vinyl polymerization is eliminated or kept to a minimum. The reaction temperature is held until the theoretical free remaining isocyanate weight percent is obtained as determined by titration of an aliquot from the reaction vessel with dibutylamine.

When that reaction is theoretically complete, the temperature is maintained and there is added with agitation one equivalent of the second active hydrogen containing compound, which may or may not contain olefinic unsaturation, e.g., hydroxyethyl acrylate, for each equivalent of the remaining isocyanate groups on the intermediate. If the compound contains unsaturation, then a vinyl polymerization inhibitor, e.g., hydroquinone, is also added in an effective amount. Preferably a catalyst for the reaction may be added to increase the speed of the reaction. Illustrative of the catalysts which may be used are metallic catalysts, e.g., organo metallics such as organotin compounds, e.g., stannous octoate, dibutyl tin dilaurate etc., organo cobalt compounds, e.g., cobalt naphthenate, lead compounds, e.g., lead octoate, zinc compounds, e.g., zinc octoate. Other known catalysts such as mineral acids, e.g., hydrochloric acid, nitric acid or the like or phosphines can be used. If used, an effective amount should be present in the reaction. The agitation is continued for a period of time sufficient to assure complete reaction, i.e., no remaining free isocyanate groups. The reaction mixture is cooled and yields the essentially monomeric novel compounds of this invention, which may or may not contain unsaturation depending on the reactants.

Reversal of the addition procedure, i.e., adding diisocyanate to e.g., polyol, rather than polyol to diisocyanate results in high viscosity, high molecular weight polymers, rather than the lower viscosity, lower molecular weight monomeric adducts of this invention.

The procedure for the preparation of the unsaturated monomers used in this invention described above may be conducted with only the reactant, inhibitor and catalyst present; or in the presence of suitable solvents which may be subsequently removed, e.g., by vacuum stripping; or in a reaction medium of vinyl compounds, especially unsaturated esters, preferably higher boiling acrylates, e.g., ethyl hexyl acrylates, ethylene glycol diacrylate, trimethylolpropane triacrylate, pentaerythritol tetraacrylate, etc.; or a plasticizer such as those of this invention, or dioctyl phthalate, etc., as a solvent medium and plasticizer; or any combination thereof.

The above description generally illustrates but one procedure for the preparation of the compounds of this invention. Variations are possible and in many instances desirable. For example, one may use only one monoactive hydrogen containing compound and react it in one step with the diisocyanate. Consequently, the isocyanate terminated intermediate is not formed in a separate step, but transiently in an ongoing reaction to form the final product.

The unsaturated monomers with which the solvent-soluble, light-sensitive diazonium compounds described previously can be incorporated to form the coating composition for making plates and articles according to this invention eminently meet the particular requirements of the lithographic plate-making art in that they are or cross-link to form compounds or resins which are oleophilic in character thereby providing adequate ink receptivity and good differential with hydrophilic non-image or non-object areas, are or are compatible with film-formers that are soluble in common organic solvents, substantially or completely insoluble in water, and are compatible both physically and chemically with the light-sensitive diazonium components. Moreover, the unsaturated monomers may be formulated into compositions which form good continuous films, have exceptional abrasion resistance, are sufficiently hard for long wear during pressruns, and have a requisite degree of resiliency and flexibility without undue brittleness, again for extended presslife. Chemical and physical stability, such as to the conditions of printing on offset presses and to the chemicals and inks used in connection therewith, also are important properties possessed by the unsaturated monomers and their cross-linked reaction products.

The inclusion of fatty acid moieties, e.g., those containing from about 6 to about 18 carbon atoms, in the photopolymerizable compositions enhances the oleophilicity of those compositions for certain utilities, e.g., inks and lithographic plates.

It is possible to cure coatings of the instant compositions. For example, with suitable agents in compositions containing the unsaturated monomers the monomers can be cross-linked or cured during exposure to actinic light and/or can be cured by heat instead of or before or after exposure to actinic light. Curing generally will enhance properties such as abrasion resistance, bonding to the substrate and cohesive character of the coating. Curing agents for this purpose are used in small amounts, i.e., in amounts less than about 5% by weight of the unsaturated monomer and generally less than about 1%, and include peroxides, for example dicumyl peroxide, and the like. The more stable peroxides are preferred.

A solvent may be used to blend the unsaturated monomer and the light-sensitive diazonium components, and to coat them as an integral composition onto an appropriate base sheet to form an article of the invention, e.g., a presensitized lithographic plate. A suitable solvent desirably should dissolve both the unsaturated and the diazo at least to an extent that a commercially practical coating solution is formed, a solution in which the resin and diazo are compatibly retained in the proportions desired for the coating subsequently to be formed on a base sheet from the solution. As pointed out previously, the light-sensitive diazonium also is soluble in organic solvent, the extent of solubility often depending upon the specific solvent. Many common organic solvents sufficiently dissolve both the monomer and the diazo; certain solvents are especially advantageous for making coating solutions of specific combinations of the monomer and a diazonium component.

Practical organic solvents, used along or in combination with others, and which are thus presently preferred according to this invention, include methylene chloride, dimethyl formamide, dimethyl sulfoxide, butyl Carbitol, methyl Cellosolve, methyl Cellosolve acetate, ketones such as acetone, methyl ethyl ketone and cyclohexanone, ethers such as trioxane and dioxane, and heterocyclics such as tetrahydrofuran, pyridine and isophorone. Methyl Cellosolve and methyl ethyl ketone are particularly suitable solvents to use.

Different relative amounts of unsaturated monomer-diazonium can be incorporated into the coating composition. In general, even if the monomer content of the coated image area is too small, a satisfactory printing plate can be made, but the full advantages of this invention cannot be obtained. The desirable abrasion resistance and wear resistance provided by the unsaturated monomeric component in the coating for exceptionally long presslife will not be sufficient relative to a plate on which the image does not contain that component. On the other hand if the content of the component is too large, the light-sensitivity of the coating composition might be insufficient for an efficient and practical plate. Also, because the developer must penetrate the unsaturated monomer-diazonium coating to loosen the bond between the coating and the base to remove the non-image area, a high proportion of monomer reduces the ease and time of developing. Another factor disfavoring too large a proportion of resin, which superficially might seem desirable, is that there would not be sufficient diazonium to be affected by the developer for ready removal of the non-image area.

With the foregoing desiderata in mind, it presently appears possible to make useful articles with unsaturated monomer-diazonium compositions of the invention containing from about 10% to about 95% by weight of the unsaturated monomeric component. A more practical and desirable range is between about 20% and about 60% of the component, preferably about 20% to about 50% with a negative-acting diazonium, and about 33% to about 60% with a positive-acting diazonium. Each of the foregoing percentages being based on the total weight of the unsaturated monomer and the diazonium compound.

In many instances it is preferred to blend the instant compositions with resins and adhesives to improve the bonding of the composition coated onto the substrate. Suitable materials for that purpose include polyethylene oxides such as Polyox TM resins sold by Union Carbide Corp., aromatic oxide resins such as Phenoxy resins sold by Union Carbide, polyamides such as Zytel TM resins sold by E. I. duPont, phenol-formaldehyde resins such as Bakelite TM phenolic resins sold by Union Carbide, acrylics such as Acryloid TM resins sold by E. I. duPont, ureaformaldehyde resins such as Uformite TM resins sold by Rohm and Haas Co., and hydroxyethyl cellulose such as Cellosize TM resins sold by Union Carbide. The amounts of those resins can vary from about 10% to about 100% by weight based on the weight of the unsaturated monomer. Whereas the addition of resins to the coating composition tends to improve the presslife of a plate the coating can also be strengthened and its surface appearance and character improved by the addition of reinforcing fillers, for example, synthetic silicas, such as Syloid TM sold by W. R. Grace Co. To obtain more uniform surface coverage, the addition of anionic surfactants to the compositions can also be beneficial, for example, Alcolec TM sold by American Lecithin Co. The coatings can be suitably colored by incorporation of a dye and/or a pigment dispersion.

Different amounts of the unsaturated monomer-diazonium composition may be coated per unit area of substrate. The thickness of the ultimate image or object area on the article or plate will vary in accordance with the coating weight. Too small an amount results in too little material in the object or image area. Hence less than the prolonged durability and presslife otherwise attainable is achieved. Too much of the composition, however, results in thick coatings that are more difficult to develop and into which the penetration of light during exposure either is insufficient or requires an unnecessarily long time; especially considered from a commercial standpoint. Coatings in an amount of from about 25 milligrams to about 500 milligrams per square foot (msf) of base sheet surface strike a satisfactory balance between those parameters. A preferred range is about 100 msf to about 250 msf of the composition.

Coating thickness depends mainly on the concentration of the coating solution and the mechanical means by which it is applied to base sheets. For example, in a continuous process wherein a roll of sheet aluminum is passed through a coating tank, there must be taken into account for each particular system the speed of the web, the tank length, subsequent drying time and temperature, and solvent volatility. The concentration of the coating solution can vary. Presently, from about one to about twenty parts of unsaturated monomer and diazonium per 100 parts of solvent can be used, good results being obtainable at concentrations of about three to about ten parts thereof.

A presensitized lithographic plate or other articles made as described above may be exposed to light through an image transparency and the non-image area may be removed by developing the plate. The methods and means of exposing and developing the exposed plate are those well known and commonly used in the lithographic art.

Although the mechanism of the light-promoted reactions in the diazonium components is not clearly understood, it does appear that the reaction(s) cause a sufficient differential between exposed and unexposed areas on the plate so that the developing solution effects removal of the non-image area without affecting the image area. In the case of a negative-acting diazonium, one or more of several reactions might occur in the exposed image area to harden it and render it stable to the developer. For example, the diazonium might react with the unsaturated monomer by a free-radical or some other mechanism, perhaps to form cross-links, or might react with itself. While similar reactions might occur in the positive-acting diazonium components, it seems more likely that the light-promoted reaction renders them susceptible to the developing solution.

An important advantage of some of the plates provided by this invention, however, is that completely or substantially completely aqueous developing media can be used to remove the unsaturated monomer-diazonium coating in the non-image areas. To facilitate development it is possible and usually preferable to include in the water a developing agent, such as a wetting agent, that more readily enables the water to penetrate the unsaturated monomer-diazonium composition of the coating, loosen the coating from the base and thereby remove the coating in the non-image area. Such agents are used advantageously to reduce the time needed to develop the plate and thus to reduce labor costs. Some that have been found to be especially suitable for developing the plates of this invention include trisodium phosphate, Duponols, e.g., WAQ, which are aqueous solutions of lauryl sodium sulfate sold by duPont, Tergitol, nonionic and anionic polyglycol ethers and sulfated linear alcohols sold by Union Carbide Corp., and Tween, fatty acid esters of anhydrous sorbitol sold by Atlas Powder Co. Good results can be obtained by using a wetting agent in an amount up to in the order of about 15% by weight of water, e.g., up to about 5% (30% by solution weight) of a commercial wetting agent such as Dupanol WAQ or up to about 10% of trisodium phosphate. Also useful are the developer compositions which are described in U.S. patent applications Ser. Nos. 302,994, 303,072 and 303,071 of W. Rowe and E. Golda, L. Katz and E. Golda, and L. Katz, W. Rowe and E. Golda, respectively.

It is also possible to use a small amount of an organic solvent in the aqueous developer, particularly to develop plates coated with a composition containing a relatively large proportion of unsaturated monomer to diazonium component. Such solvents aid in removing the coating by softening any resin therein. Generally the development time is short enough and the concentration of organic solvent in the developer is low enough so that nothing untoward happens to the image area. Up to about 5% by weight of organic solvent, and in some instances up to about 10%, can be used advantageously to obtain enhanced efficiency of development. Typical organic solvents include lower alcohols such as isopropanol and cyclohexanol, esters such as butyl acetate, ethers such as butyl acetate, ethers such as methyl Cellosolve, ketones such as cyclohexanone and acetone, and Dowanol, P-Mix, a polypropylene glycol ether sold by Dow Chemical. Cyclohexanone is a preferred solvent.

In the following Examples all parts and percentages are by weight.

EXAMPLE 1

One surface of an aluminum plate was brush-grained, anodized and chemically treated with sodium silicate solution to form a coating which functions as an interlayer in the finished plate. The treated plate surface was then whirler coated with a light-sensitive coating comprising: 1 part of sensitizer (addition product of 2-hydroxy-4-methoxybenzophenone-5-sulfonic acid and para-diazo diphenyl amineformaldehyde condensate), 2 parts of a compound which is the substantially monomeric reaction product of 1 mole of castor oil and 3 moles of tolylene diisocyanate to form an isocyanate terminated intermediate which is then reacted with 3 moles of 2-hydroxyethyl acrylate, 5 parts of a compound which is the substantially monomeric reaction product of 1 mole of trimethylolpropane and 3 moles of tolylene diisocyanate to form an isocyanate terminated intermediate, which is then reacted with 3 moles of 2-hydroxyethyl acrylate, and 0.1 part Basic Blue Dye 6G (available from General Dyestuffs, Color Index #1). The coating is made from a 5% solution in a solvent mixture of 60% methyl cellosolve, 30% ethylene dichloride and 10% dimethylformamide. After drying, the coating on the plate had a weight of about 100 mg/ft.$^2$. After exposure of the plate in a Nu Arc frame to ultraviolet light for one minute through a negative transparency, unexposed areas of the plate were easily removed with the aqueous developer formulation #922 available from Polychrome Corporation to yield commercially acceptable lithographic plates.

The method of development was by hand application of the developer with an applicator pad. The grey scale was solid 6, tail 10. The grey scale used is a continuous tone 21-step guide which is available from Stouffer Graphic Arts Equipment Company (South Bend, Ind.).

A press run was conducted by locking-up the plate on a Chief 22 lithographic press which was 0.006" "over-packed", by which is meant that the plate was shimmed-up to 0.006" higher than normal, thereby causing the plate to contact the rollers with a pressure greater than would normally be used. Over-packing causes excessive wear of the plate compared to what would occur on a properly adjusted press. The fountain solution contained 35% isopropanol. Usually fountain solutions contain no more than 25% alcohol. The more alcohol in the fountain solution, the greater the adverse effect on the image area of the plate that can be expected. The ink used was Chromatone #4559 (a product of Chromatone Printing Ink Company, a subsidiary of Polychrome Corporation). The paper used was 70 lb. white offset paper which was reused a maximum of three times. 20,000 acceptable copies were printed.

EXAMPLE 2

Example 1 was repeated, but the aluminum was given a potassium zirconium fluoride treatment instead of a sodium silicate treatment. Results were similar.

EXAMPLE 3

Example 1 was repeated, but the aluminum was chemically etched, anodized and sodium silicate treated. Results were similar.

EXAMPLE 4

Example 1 was repeated but 3 parts of sensitizer, 2 parts of the second component, 7 parts of the third component, and 0.1 part of Calco Spirit Blue Base N dye (American Cyanamid, Color Index 42775) were used. Results were similar.

EXAMPLE 5

Example 1 was repeated but the coating also contained 2 parts of Formvar 12/85 Resin. The results were similar.

EXAMPLE 6

Example 1 was repeated, but the coating formulation was:
2 parts sensitizer
1 part glycidyl ether polyepoxide
½ part Formvar 12/85
1 part of the third component of the formulation in Example 1.
0.1 part of Basic Blue Dye
Exposure was 1 minute in a Nu Arc mercury frame and developed as in Example 1. Grey scale was Solid 6, Tail 11. A total of 45,000 impressions were obtained on the over-packed press. There was no image wear evident from inspection of the plate or the printed copy and the grey scale had lost only ½ step relative to the original.

EXAMPLE 7

Example 1 was repeated but the formulation was:
1 part sensitizer
5 parts of the reaction product of (A) the isocyanate terminated intermediate formed from 1 mole of caster oil and 3 moles of tolylene diisocyanate and (B) 3 moles of 2-hydroxyethyl methacrylate
4 parts of the reaction product of (A) the isocyanate terminated intermediate formed from 1 mole of a caprolactone diol (Niax 510, 530 molecular weight, sold by Union Carbide) and 2 moles of 4,4'-methylene bis (cyclohexyl isocyanate) and (B) 2 moles of allylamine
0.2 parts Calco Spirit Blue Base N dye
After drying the coating with infrared lamps at 150° for 5 minutes, the plate was exposed through a negative transparency by a pulse Xenon type frame for 30 seconds. Development was accomplished with #923 aqueous developer sold by Polychrome Corporation. The plate was gummed in the conventional manner and 5,000 acceptable copies were printed on the overpacked press.

EXAMPLE 8

Example 1 was repeated, but the second component was replaced with the reaction product of (A) the isocyanate terminated intermediate formed from 1 mole of caster oil and 3 moles of tolylene diisocyanate and (B) 3 moles of methyl Cellosolve. An acceptable plate was produced.

EXAMPLE 9

Example 1 is repeated, but the negative-acting sensitizer is replaced with 3 parts of a positive-acting sensitizer described in U.S. Pat. No. 3,635,709 and a coating weight of 200 mg/ft$^2$ is used. After drying, then exposure through a positive transparency for 2½ minutes in a Nu Arc exposure frame, and development with #985 Developer sold by Polychrome Corporation, there was produced a lithographic plate useful for printing.

What is claimed is:

1. A light sensitive element which comprises: a substrate and an ultraviolet radiation curable composition applied to at least one surface of said substrate, which composition comprises the admixture of:
   I. From about 10 to 95% by weight of an unsaturated monomer, based on total weight of the unsaturated monomer and diazonium compound, wherein the unsaturated monomer is the reaction product of:
      A. one equivalent of an isocyanate containing intermediate which is the reaction product of i. about one equivalent of a polyol with ii. two equivalents of a diisocyanate and
      B. one equivalent of a monomeric olefinically active hydrogen in the form of a hydroxyl group, said reaction product being a monomeric, solvent-free liquid containing zero percent free isocyanate groups, and
   II. From about 1 to 95% by weight, based on the weight of the unsaturated monomer, of one or more solid resins selected from the group consisting of polyurethanes, epoxies, polyvinyl acetals, polyethylene oxides, polyamides, phenol formaldehydes, acrylics, ureaformaldehydes, and cellulosic resins, and
   III. From about 10–95%, based on total weight of unsaturated monomer and diazonium compound of a light sensitive, negative acting diazonium compound,
   whereby before light exposure said admixture is organic solvent soluble, water emulsifiable and is capable of forming a non-tacky solid film and after light exposure said admixture is not soluble in organic solvents and is non-water emulsifiable.

2. The element of claim 1 wherein said compound (i) is a diol.

3. The element of claim 1 wherein said compound (B) is an acrylate or methacrylate.

4. The element of claim 1 wherein compound (i) is a triol.

5. The element of claim 1 wherein said admixture further comprises a vinyl polymerization inhibitor in an amount of from 50 to 1,000 p.p.m.

6. The element of claim 1 wherein said admixture further comprises a dye or pigment.

7. The element of claim 1 wherein said substrate is aluminum.

8. The element of claim 1 wherein said substrate is aluminum, said compound (B) is an acrylate or methacrylate, said compound II is a polyurethane, epoxy or polyvinyl acetal and said compound III is the addition product of 2-hydroxy-4-methoxy benzophenone-5-sulfonic acid and the paradiazo diphenylamineformaldehyde condensate.

* * * * *